US012675040B2

(12) United States Patent
Nakagawa

(10) Patent No.: US 12,675,040 B2
(45) Date of Patent: Jul. 7, 2026

(54) SUBSTRATE WITH MULTILAYER REFLECTIVE FILM, REFLECTIVE MASK BLANK, METHOD FOR MANUFACTURING REFLECTIVE MASK, AND METHOD FOR MANUFACTURING SEMICONDUCTOR DEVICE

(71) Applicant: HOYA CORPORATION, Tokyo (JP)

(72) Inventor: Masanori Nakagawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 592 days.

(21) Appl. No.: 18/024,918

(22) PCT Filed: Sep. 15, 2021

(86) PCT No.: PCT/JP2021/033837

§ 371 (c)(1),
(2) Date: Mar. 6, 2023

(87) PCT Pub. No.: WO2022/065144

PCT Pub. Date: Mar. 31, 2022

(65) Prior Publication Data

US 2023/0314928 A1      Oct. 5, 2023

(30) Foreign Application Priority Data

Sep. 28, 2020    (JP) ................................. 2020-162097

(51) Int. Cl.
*G03F 1/24*            (2012.01)
(52) U.S. Cl.
CPC ..................................... *G03F 1/24* (2013.01)

(58) Field of Classification Search
CPC ..................................... G03F 1/24; G03F 1/22
See application file for complete search history.

(56) References Cited

U.S. PATENT DOCUMENTS

| | | |
|---|---|---|
| 2003/0162005 A1 | 8/2003 | Shoki |
| 2004/0131947 A1 | 7/2004 | Fisch et al. |
| 2011/0165504 A1 | 7/2011 | Ikuta |
| 2012/0107733 A1 | 5/2012 | Hayashi et al. |
| 2013/0164660 A1 | 6/2013 | Hayashi |
| 2015/0010854 A1 | 1/2015 | Seo et al. |

(Continued)

FOREIGN PATENT DOCUMENTS

| | | |
|---|---|---|
| CN | 110383167 A | 10/2019 |
| JP | 2003257824 A | 9/2003 |

(Continued)

OTHER PUBLICATIONS

Communication dated Aug. 14, 2025 in Korean Application No. 10-2023-7008903.

(Continued)

*Primary Examiner* — Daborah Chacko-Davis
(74) *Attorney, Agent, or Firm* — Sughrue Mion, PLLC

(57)          ABSTRACT

A substrate with a multilayer reflective film, a reflective mask blank, a method for manufacturing a reflective mask, and a method for manufacturing a semiconductor device capable of preventing film peeling of a multilayer reflective film due to cleaning or the like during a mask manufacturing process and use of a mask, and reducing occurrence of defects on an absorber film due to the film peeling of the multilayer reflective film.

23 Claims, 5 Drawing Sheets

(56) References Cited

U.S. PATENT DOCUMENTS

| | | |
|---|---|---|
| 2018/0157166 A1 | 6/2018 | Ikebe et al. |
| 2019/0101817 A1* | 4/2019 | Lin ........................... G03F 1/24 |
| 2020/0064725 A1 | 2/2020 | Nozawa et al. |

FOREIGN PATENT DOCUMENTS

| | | |
|---|---|---|
| JP | 2010118520 A | 5/2010 |
| JP | 2016122751 A | 7/2016 |
| KR | 10-2015-0004168 A | 1/2015 |
| TW | 201015208 A | 4/2010 |
| TW | 201122721 A1 | 7/2011 |
| TW | 201219966 A1 | 5/2012 |

OTHER PUBLICATIONS

PCT/JP2021/033837, English Translation of "International Search Report", Oct. 26, 2021, 2 pages.
Communication dated Dec. 15, 2025 in Taiwanese Application No. 114134753.

* cited by examiner (a)

SUBSTRATE WITH MULTILAYER REFLECTIVE FILM, REFLECTIVE MASK BLANK, METHOD FOR MANUFACTURING REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2021/033837, filed Sep. 15, 2021, which claims priority to Japanese Patent Application No. 2020-162097, filed Sep. 28, 2020, and the contents of which is incorporated by reference.

TECHNICAL FIELD

The present disclosure relates to a substrate with a multilayer reflective film, a reflective mask blank, a method for manufacturing a reflective mask, and a method for manufacturing a semiconductor device.

BACKGROUND ART

With a further requirement for higher density and higher accuracy of a VLSI device in recent years, EUV lithography, which is an exposure technique using extreme ultraviolet (hereinafter, referred to as "EUV") light, is promising. The EUV light refers to light in a wavelength band of a soft X-ray area or a vacuum ultraviolet area, and specifically refers to light having a wavelength of about 0.2 to 100 nm.

The reflective mask includes a multilayer reflective film for reflecting exposure light formed on a substrate, and an absorber pattern which is a patterned absorber film formed on the multilayer reflective film for absorbing exposure light. Light incident on the reflective mask mounted on an exposure machine for performing pattern transfer on a semiconductor substrate is absorbed in a portion with the absorber pattern and is reflected by the multilayer reflective film in a portion without the absorber pattern. A light image reflected by the multilayer reflective film is transferred onto the semiconductor substrate such as a silicon wafer through a reflective optical system.

As the multilayer reflective film, a multilayer film in which layers containing elements having different refractive indices are periodically layered is generally used. For example, as a multilayer reflective film with respect to EUV light having a wavelength of 13 to 14 nm, a Mo/Si periodic layered film in which a Mo film and a Si film are alternately layered for about 40 periods is preferably used.

Patent Document 1 describes a reflective mask blank for EUV lithography including a substrate, a multilayer reflective film formed on a surface of the substrate, a protective film formed on the multilayer reflective film, and an absorption film formed on the protective film.

PRIOR ART DOCUMENTS

Patent Documents

Patent Document 1: JP 2016-122751 A

DISCLOSURE OF INVENTION

Technical Problem

A reflective mask blank generally has a structure in which a multilayer reflective film that reflects exposure light (EUV light) is formed on one main surface of a substrate, and an absorber film that absorbs exposure light (EUV light) is formed on the multilayer reflective film.

When a reflective mask is manufactured using the reflective mask blank, first, a resist film for electron beam drawing is formed on a surface of the reflective mask blank. Next, a desired pattern is drawn on the resist film with an electron beam, and the pattern is developed to form a resist pattern. Next, using this resist pattern as a mask, an absorber film is dry-etched to form an absorber pattern (transfer pattern). As a result, a reflective mask in which the absorber pattern is formed on a multilayer reflective film can be manufactured.

In recent years, requirement for the quality of the reflective mask has increased, and defects caused by a multilayer reflective film in a substrate with a multilayer reflective film and a reflective mask blank, which have not caused a problem in related art, have become a problem.

The multilayer reflective film in the reflective mask blank is usually formed on a main surface of a substrate using an ion beam sputtering device or a magnetron sputtering device. The multilayer reflective film may be formed so as to go around an end surface of the substrate. In addition, the multilayer reflective film may be formed so as not to go around the end surface of the substrate. In a case where the substrate is held using an electrostatic chuck device at the time of forming the multilayer reflective film, the multilayer reflective film is usually formed so as to go around the end surface of the substrate. Meanwhile, in a case where the substrate is held using a mechanical chuck device (for example, a chuck device described in JP 2005-77845 A) at the time of forming the multilayer reflective film, a peripheral edge portion of a main surface of the substrate is covered with an upper surface plate of the chuck device. Therefore, the multilayer reflective film is usually formed so as not to go around the end surface of the substrate. Then, the resist film is formed on the entire surface of the reflective mask blank. In order to suppress generation of dust due to peeling of the resist film on a substrate peripheral edge portion, the resist film on the substrate peripheral edge portion on which the mask pattern is not formed is usually removed (edge rinse).

When the reflective mask is manufactured as described above using the reflective mask blank from which the resist film on the substrate peripheral edge portion has been removed (in other words, no resist film is formed on the substrate peripheral edge portion), no resist film is formed on the substrate peripheral edge portion. Therefore, the exposed absorber film is removed by etching, and the multilayer reflective film under the absorber film is exposed. Usually, in a process for manufacturing a reflective mask, after an absorber pattern is formed, wet cleaning using an acidic or alkaline aqueous solution (chemical solution) is performed in order to remove a resist pattern. In addition, also in manufacture of a semiconductor device, wet cleaning using a chemical solution is performed in order to remove foreign substances adhering to a reflective mask during exposure. The cleaning is performed at least a plurality of times. As a multilayer reflective film with respect to EUV light having a wavelength of 13 to 14 nm, a Mo/Si periodic layered film in which a Mo film and a Si film are alternately layered for about 40 periods is preferably used. Due to this cleaning, the multilayer reflective film exposed at a substrate peripheral edge portion is damaged, and film peeling may occur. Such film peeling of the multilayer reflective film may cause serious pattern defects.

In the substrate with a multilayer reflective film and the reflective mask blank described in Patent Document 1, a modified area is formed in an outer peripheral area of the multilayer reflective film. This modified area is formed of a compound of a material of a high refractive index layer and a material of a low refractive index layer constituting the multilayer reflective film. By forming such a modified area, it is possible to reduce occurrence of defects due to film peeling of the multilayer reflective film and the absorber film. As the material of the high refractive index layer, a material containing silicon (Si) is used. As the material of the low refractive index layer, a material containing molybdenum (Mo) is used.

According to the substrate with a multilayer reflective film and the reflective mask blank described in Patent Document 1, since the modified area is formed in the outer peripheral area of the multilayer reflective film, chemical resistance at an end portion of an outer periphery of the multilayer reflective film is improved, and film peeling of the multilayer reflective film can be reduced. However, since the modified area contains Si and a silicide film having a high Si content has a high compressive stress, there is a problem that film peeling of the multilayer reflective film and defects on the absorber film caused by the film peeling cannot be sufficiently reduced.

Solution to Problem

The present disclosure has been made in order to solve the above problem. An aspect of the present disclosure is to provide a substrate with a multilayer reflective film, a reflective mask blank, a method for manufacturing a reflective mask, and a method for manufacturing a semiconductor device capable of preventing film peeling of a multilayer reflective film due to cleaning or the like during a mask manufacturing process and use of a mask, and reducing occurrence of defects on the multilayer reflective film or on an absorber film due to the film peeling of the multilayer reflective film.

In order to solve the above problems, the present disclosure has the following configurations.

(Configuration 1)

A substrate with a multilayer reflective film comprising a substrate and a multilayer reflective film formed on a main surface of the substrate, in which the multilayer reflective film comprises a structure in which a high refractive index layer and a low refractive index layer are alternately layered, the high refractive index layer is formed of a material comprising Si, and the low refractive index layer is formed of a material comprising a transition metal, an outermost periphery of the multilayer reflective film is formed of a compound comprising Si and a transition metal, and a ratio of a content (atomic %) of Si to a total content (atomic %) of Si and the transition metal in the compound is 0.50 or less.

(Configuration 2)

The substrate with a multilayer reflective film according to configuration 1, in which the compound comprises oxygen.

(Configuration 3)

The substrate with a multilayer reflective film according to configuration 2, in which a content of the oxygen in the compound is 0.5 atomic % or more and 75 atomic % or less.

(Configuration 4)

The substrate with a multilayer reflective film according to any one of configurations 1 to 3, wherein a protective film is formed on the multilayer reflective film.

(Configuration 5)

A reflective mask blank in which a multilayer reflective film having a high refractive index layer and a low refractive index layer alternately layered and an absorber film are formed on a main surface of a substrate, in which the high refractive index layer in the multilayer reflective film is formed of a material comprising Si, and the low refractive index layer is formed of a material comprising a transition metal, an outermost periphery of the multilayer reflective film formed on the main surface is formed of a compound comprising Si and a transition metal, and a ratio of a content (atomic %) of Si to a total content (atomic %) of Si and the transition metal in the compound is 0.50 or less.

(Configuration 6)

The reflective mask blank according to configuration 5, in which the compound comprises oxygen.

(Configuration 7)

The reflective mask blank according to configuration 6, in which a content of the oxygen in the compound is 0.5 atomic % or more and 75 atomic % or less.

(Configuration 8)

The reflective mask blank according to any one of configurations 5 to 7, in which a protective film formed of a material having different etching selectivity from the absorber film is formed between the multilayer reflective film and the absorber film.

(Configuration 9)

The reflective mask blank according to any one of configurations 5 to 8, in which a resist film is formed on the absorber film.

(Configuration 10)

The reflective mask blank according to configuration 9, in which an end portion of an outer periphery of the resist film is located above an outermost periphery of the multilayer reflective film formed of the compound.

(Configuration 11)

A method for manufacturing a reflective mask, the method comprising preparing the reflective mask blank according to configuration 9 or 10 and patterning the absorber film to form an absorber pattern on the multilayer reflective film.

(Configuration 12)

A method for manufacturing a semiconductor device, the method comprising transferring an absorber pattern onto a resist film on a semiconductor substrate using a reflective mask obtained by the method for manufacturing a reflective mask according to configuration 11.

Advantageous Effects of Disclosure

The present disclosure can provide a substrate with a multilayer reflective film, a reflective mask blank, a method for manufacturing a reflective mask, and a method for manufacturing a semiconductor device capable of preventing film peeling of a multilayer reflective film due to cleaning or the like during a mask manufacturing process and use of a mask, and reducing occurrence of defects on the multilayer reflective film or on an absorber film due to the film peeling of the multilayer reflective film.

BRIEF DESCRIPTION OF DRAWINGS

FIGS. 4a to 4f are schematic views illustrating an example of a method for manufacturing a reflective mask.

FIG. 5 is a schematic diagram illustrating a pattern transfer device.

DESCRIPTION OF EMBODIMENTS

Hereinafter, an embodiment of the present disclosure will be specifically described with reference to the drawings. Note that the following embodiment is a mode for specifically describing the present disclosure and does not limit the present disclosure within the scope thereof.

Figure 1:
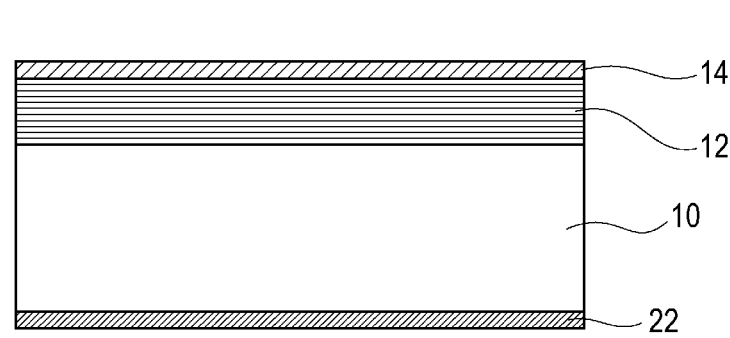
FIG. 1 is a schematic cross-sectional view illustrating an example of a substrate with a multilayer reflective film of the present embodiment.

FIG. 1 is a schematic cross-sectional view illustrating an example of a substrate with a multilayer reflective film 100 of the present embodiment. The substrate with a multilayer reflective film 100 illustrated in FIG. 1 includes a substrate 10 and a multilayer reflective film 12 formed on the substrate 10. A protective film 14 may be formed on the multilayer reflective film 12. A conductive back film 22 for an electrostatic chuck may be formed on a back surface of the substrate 10 (surface opposite to the side where the multilayer reflective film 12 is formed).

Note that here, "on" a substrate or a film includes not only a case of being in contact with a top surface of the substrate or the film but also a case of being not in contact with the top surface of the substrate or the film. That is, "on" a substrate or a film includes a case where a new film is formed above the substrate or the film, a case where another film is interposed between the substrate or the film and an object "on" the substrate or the film, and the like. In addition, "on" does not necessarily mean an upper side in the vertical direction. "On" merely indicates a relative positional relationship among a substrate, a film, and the like.

<Substrate>

As the substrate 10, a substrate having a low thermal expansion coefficient within a range of 0±5 ppb/° C. is preferably used in order to prevent distortion of a transfer pattern due to heat during exposure to EUV light. As a material having a low thermal expansion coefficient within this range, for example, $SiO_2$—$TiO_2$-based glass, multicomponent-based glass ceramics, or the like can be used.

A main surface of the substrate 10 on a side where a transfer pattern (an absorber pattern described later) is formed is preferably processed in order to increase a flatness. By increasing the flatness of the main surface of the substrate 10, position accuracy and transfer accuracy of the pattern can be increased. For example, in a case of EUV exposure, the flatness in an area of 132 mm×132 mm of the main surface of the substrate 10 on the side where the transfer pattern is formed is preferably 0.1 μm or less, more preferably 0.05 μm or less, and particularly preferably 0.03 μm or less. The main surface (back surface) opposite to the side where the transfer pattern is formed is a surface fixed to the exposure apparatus by an electrostatic chuck. The flatness in an area having a size of 142 mm×142 mm of the back surface is preferably 0.1 μm or less, more preferably 0.05 μm or less, and particularly preferably 0.03 μm or less. Note that here, the flatness is a value indicating surface warpage (deformation amount) represented by total indicated reading (TIR). Specifically, the flatness is an absolute value of a difference in height between the highest position of a substrate surface above a focal plane and the lowest position of the substrate surface below the focal plane, in which the focal plane is a plane defined by a minimum square method using the substrate surface as a reference.

In a case of EUV exposure, the main surface of the substrate 10 on the side where the transfer pattern is formed preferably has a surface roughness of 0.1 nm or less in terms of root mean square roughness (Rq). Note that the surface roughness can be measured with an atomic force microscope.

The substrate 10 preferably has a high rigidity in order to prevent deformation of a film (such as the multilayer reflective film 12) formed on the substrate 10 due to a film stress. In particular, the substrate 10 preferably has a high Young's modulus of 65 GPa or more.

<Multilayer Reflective Film>

The multilayer reflective film 12 has a structure in which a plurality of layers mainly containing elements having different refractive indices is periodically layered. In general, the multilayer reflective film 12 is constituted by a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods.

In order to form the multilayer reflective film 12, the high refractive index layer and the low refractive index layer may be layered in this order from the substrate 10 side for a plurality of periods. In this case, one (high refractive index layer/low refractive index layer) stack is one period.

Note that an uppermost layer of the multilayer reflective film 12, that is, a surface layer of the multilayer reflective film 12 on a side opposite to the substrate 10 is preferably constituted by the high refractive index layer. When the high refractive index layer and the low refractive index layer are built up in this order from the substrate 10 side, the low refractive index layer forms the uppermost layer. However, when the low refractive index layer forms a surface of the multilayer reflective film 12, the reflectance of the surface of the multilayer reflective film is reduced due to easy oxidation of the low refractive index layer. Therefore, the high refractive index layer is preferably formed on the low refractive index layer. Meanwhile, when the low refractive index layer and the high refractive index layer are built up in this order from the substrate 10 side, the high refractive index layer forms the uppermost layer. In this case, the high refractive index layer forming the uppermost layer forms a surface of the multilayer reflective film 12.

The high refractive index layer included in the multilayer reflective film 12 is a layer formed of a material containing Si. The high refractive index layer may contain a Si simple substance or a Si compound. The Si compound may contain Si and at least one element selected from the group consisting of B, C, N, O, and H. By using the layer containing Si as the high refractive index layer, a multilayer reflective film having an excellent reflectance with respect to EUV light can be obtained.

The low refractive index layer included in the multilayer reflective film 12 is a layer formed of a material containing a transition metal. The transition metal contained in the low refractive index layer is preferably at least one transition metal selected from the group consisting of Mo, Ru, Rh, and Pt. The low refractive index layer is more preferably a layer formed of a material containing Mo.

For example, as the multilayer reflective film 12 for EUV light having a wavelength of 13 to 14 nm, a Mo/Si multilayer film in which a Mo film and a Si film are alternately layered for about 40 to 60 periods can be preferably used.

The reflectance of such a multilayer reflective film 12 alone is, for example, 65% or more. An upper limit of the reflectance of the multilayer reflective film 12 is, for example, 73%. Note that the thicknesses and period of layers included in the multilayer reflective film 12 can be selected so as to satisfy Bragg's law.

The multilayer reflective film 12 can be formed by a known method. The multilayer reflective film 12 can be formed by, for example, an ion beam sputtering method.

For example, when the multilayer reflective film 12 is a Mo/Si multilayer film, a Mo film having a thickness of about 3 nm is formed on the substrate 10 by an ion beam sputtering method using a Mo target. Next, a Si film having a thickness of about 4 nm is formed using a Si target. By repeating such an operation, the multilayer reflective film 12 in which Mo/Si films are layered for 40 to 60 periods can be formed. At this time, a surface layer of the multilayer reflective film 12 on a side opposite to the substrate 10 is a layer containing Si (Si film). The Mo/Si film in one period has a thickness of 7 nm.

In the substrate with a multilayer reflective film 100 of the present embodiment, an outermost periphery of the multilayer reflective film 12 contains a compound containing Si contained in the high refractive index layer and a transition metal contained in the low refractive index layer. In such a compound, a ratio of the content (atomic %) of Si to the total content (atomic %) of Si and the transition metal is 0.50 or less, preferably 0.45 or less, and more preferably 0.40 or less. A ratio of the content (atomic %) of Si to the total content (atomic %) of Si and the transition metal is preferably 0.10 or more. By adjusting the ratios of Si and the transition metal contained in the compound within such a range, a compressive stress in the compound is reduced. Therefore, it is possible to prevent film peeling of the multilayer reflective film due to cleaning or the like during a mask manufacturing process and use of a mask. As a result, it is possible to reduce occurrence of defects on the multilayer reflective film or on the absorber film due to film peeling of the multilayer reflective film. Note that the above conditions do not need to be satisfied in the entire area in the compound, and a case where the above conditions are satisfied in at least a partial area in the compound is also included in the scope of the present disclosure.

The compound contained in the outermost periphery of the multilayer reflective film 12 preferably further contains oxygen. By inclusion of oxygen in the compound, chemical resistance at the outermost periphery of the multilayer reflective film 12 is improved. In addition, the reflectance of the outermost periphery of the multilayer reflective film 12, which is a portion that does not contribute to pattern transfer, for exposure light (EUV light) can be reduced. Therefore, the pattern transfer accuracy during exposure can be further improved.

The content of oxygen in the compound contained in the outermost periphery of the multilayer reflective film 12 is preferably 0.5 atomic % or more and 75 atomic % or less, more preferably 5 atomic % or more and 60 atomic % or less, and still more preferably 5 atomic % or more and 40 atomic % or less. By the ratio of oxygen contained in the compound being adjusted within such a range, the chemical resistance at the outermost periphery of the multilayer reflective film 12 is further improved. The compound contained in the outermost periphery of the multilayer reflective film 12 can contain oxygen by temporarily taking out the substrate with a multilayer reflective film from the chamber into the atmosphere after the multilayer reflective film 12 is formed and forming the protective film 14 discontinuously from the formation of the multilayer reflective film 12. In addition, the content of oxygen in the compound can be adjusted by adjusting conditions of cleaning and heat treatment of the substrate with a multilayer reflective film.

When the transition metal contained in the low refractive index layer is molybdenum (Mo) and the material contained in the high refractive index layer is silicon (Si), the outermost periphery of the multilayer reflective film 12 is formed of a metal silicide (specifically, molybdenum silicide). Molybdenum is eluted by sulfuric acid used in SPM cleaning, but a metal silicide (specifically, molybdenum silicide) is hardly eluted by sulfuric acid. Therefore, since the chemical resistance during a mask blank manufacturing process, a mask manufacturing process, and use of a mask is improved, occurrence of film peeling due to elution of the multilayer reflective film 12 can be prevented. As a result, it is possible to reduce occurrence of defects on the multilayer reflective film or on the absorber film due to film peeling of the multilayer reflective film 12.

In the present specification, the outermost periphery of the multilayer reflective film 12 is preferably within a range of 20 mm or less, more preferably within a range of 10 mm or less, and still more preferably within a range of 6 mm or less from an outermost peripheral end portion of the multilayer reflective film 12 toward the inside.

The ratios of Si and the transition metal in the compound contained in the outermost periphery of the multilayer reflective film 12 can be adjusted by, for example, an incident angle and energy of sputtered particles when the high refractive index layer and the low refractive index layer are formed. The incident angle and energy of the sputtered particles when the high refractive index layer and the low refractive index layer are formed can be adjusted by an angle of the substrate and an angle of a sputtering target when the high refractive index layer and the low refractive index layer are formed.

Figure 7:
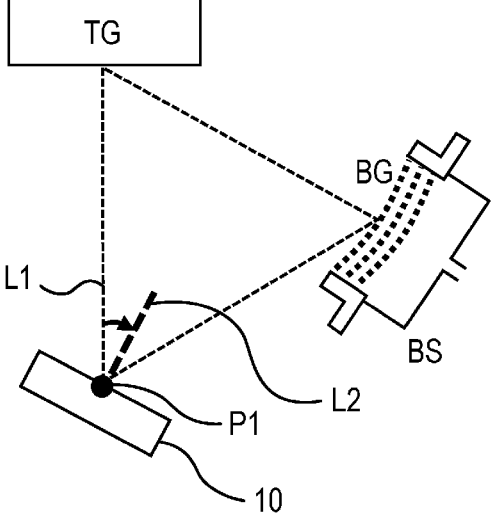
FIG. 7 is a schematic diagram illustrating an example of an ion beam sputtering device used for forming the multilayer reflective film.

In the present specification, "angle of a substrate" means an angle formed by a straight line L1 and a straight line L2 in FIG. 7. The straight line L1 is a straight line connecting a center P1 of a main surface of the substrate 10 and a center of a surface of a sputtering target TG. The straight line L2 is a straight line (normal line) that passes through the center P1 of the main surface of the substrate 10 and is perpendicular to the main surface of the substrate 10. In FIG. 7, a direction in which the substrate 10 is rotated clockwise is a positive angle.

Figure 8:
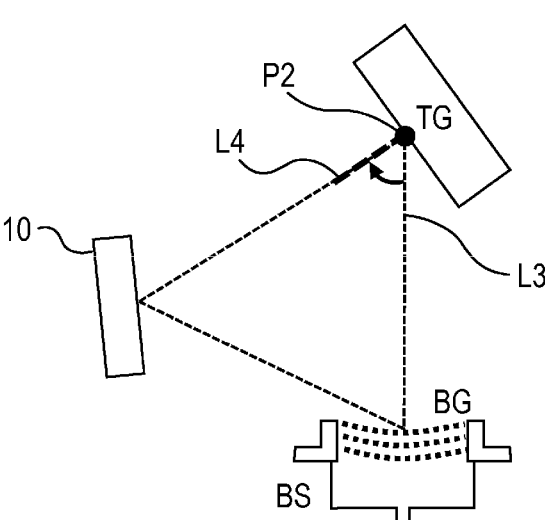
FIG. 8 is a schematic diagram illustrating an example of the ion beam sputtering device used for forming the multilayer reflective film.

In the present specification, "angle of a sputtering target" means an angle formed by a straight line L3 and a straight line L4 in FIG. 8. The straight line L3 is a straight line connecting a center P2 of a surface of the sputtering target TG and a center of a surface of a beam grid BG of an ion beam source BS. The straight line L4 is a straight line (normal line) that passes through the center P2 of the surface of the sputtering target TG and is perpendicular to the surface of the sputtering target TG. In FIG. 8, a direction in which the sputtering target TG is rotated clockwise is a positive angle.

The ratios of Si and the transition metal in the compound contained in the outermost periphery of the multilayer reflective film 12 can be adjusted by the angle of the substrate and the angle of the sputtering target. More specifically, when the low refractive index layer is formed, the angle of the substrate is preferably 20 degrees or more and 45 degrees or less, and the angle of the sputtering target is preferably 45 degrees or more and 65 degrees or less. When the high refractive index layer is formed, the angle of the substrate is preferably 20 degrees or more and 45 degrees or less, and the angle of the sputtering target is preferably 45 degrees or more and 65 degrees or less.

<Protective Film>

The substrate with a multilayer reflective film 100 of the present embodiment may have the protective film 14 on the multilayer reflective film 12. The protective film 14 has a function of protecting the multilayer reflective film 12 from dry etching and cleaning in a process for manufacturing a reflective mask 200 described later. The protective film 14 also has a function of protecting the multilayer reflective film 12 when a black defect in a transfer pattern is corrected using an electron beam (EB). By forming the protective film 14 on the multilayer reflective film 12, damage to a surface of the multilayer reflective film 12 can be suppressed when the reflective mask 200 is manufactured. As a result, a reflectance characteristic of the multilayer reflective film 12 with respect to EUV light is improved.

The protective film 14 can be formed using a known method. Examples of a method for forming the protective film 14 include an ion beam sputtering method, a magnetron sputtering method, a reactive sputtering method, a vapor phase growth method (CVD), and a vacuum vapor deposition method. The protective film 14 may be continuously formed by an ion beam sputtering method after the multilayer reflective film 12 is formed.

The protective film 14 can be formed of a material having different etching selectivity from an absorber film 24 described later. As the material of the protective film 14, for example, materials such as Ru, Ru—(Nb, Rh, Zr, Y, B, Ti, La, Mo), Si—(Ru, Rh, Cr, B), Rh, Si, Zr, Nb, La, and B can be used. When a material containing ruthenium (Ru) is used among these materials, reflectance characteristics of the multilayer reflective film 12 are further improved. Specifically, the material of the protective film 14 is preferably Ru or Ru—(Nb, Rh, Zr, Y, B, Ti, La, Mo). Such a protective film 14 is particularly effective when the absorber film 24 is formed of a Ta-based material and the absorber film 24 is patterned by dry etching with a Cl-based gas.

Figure 2:
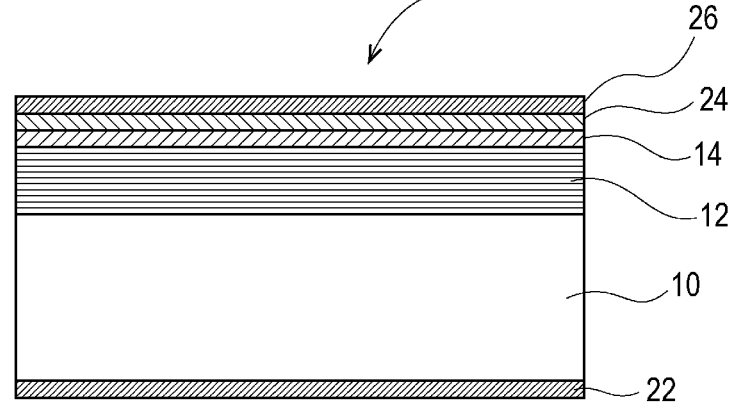
FIG. 2 is a schematic cross-sectional view illustrating an example of a reflective mask blank of the present embodiment.

FIG. 2 is a schematic cross-sectional view illustrating an example of a reflective mask blank 110 of the present embodiment. The reflective mask blank 110 illustrated in FIG. 2 includes the absorber film 24 for absorbing EUV light on the protective film 14 of the above-described substrate with a multilayer reflective film 100. The reflective mask blank 110 can further include another thin film such as a resist film 26 on the absorber film 24.

Figure 3:
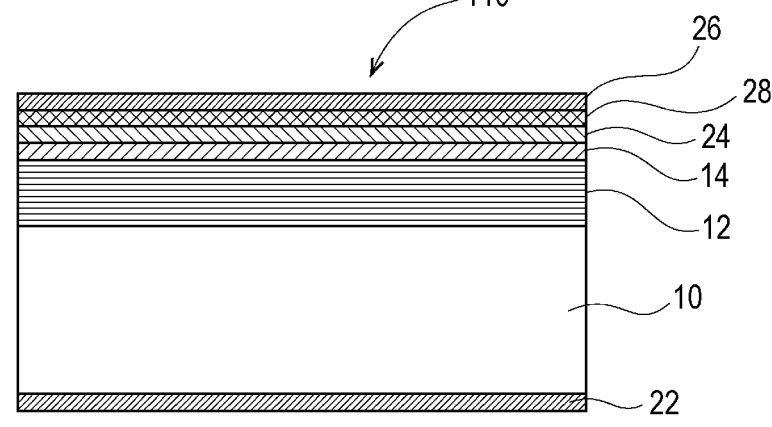
FIG. 3 is a schematic cross-sectional view illustrating another example of the reflective mask blank of the present embodiment.

FIG. 3 is a schematic cross-sectional view illustrating another example of the reflective mask blank 110 of the present embodiment. As illustrated in FIG. 3, the reflective mask blank 110 may further include an etching mask film 28 between the absorber film 24 and the resist film 26.

When the resist film 26 is formed on the absorber film 24, the resist film 26 on a substrate peripheral edge portion on which a mask pattern is not formed is usually removed (edge rinse). When the peripheral edge portion of the resist film 26 is removed, the absorber film 24 under the resist film 26 is exposed. Since the exposed absorber film 24 is removed by etching in a mask manufacturing process, the multilayer reflective film 12 under the absorber film 24 is exposed. When the multilayer reflective film 12 is exposed, the multilayer reflective film 12 may be damaged by cleaning or the like during the mask manufacturing process and use of a mask. Therefore, the end portion of the outer periphery of the resist film 26 after removal by edge rinse is preferably located above the outermost periphery of the multilayer reflective film 12. According to such a configuration, it is possible to more effectively prevent the multilayer reflective film 12 from being damaged and film peeling from occurring due to cleaning or the like during the mask manufacturing process and use of a mask.

<Absorber Film>

The absorber film 24 of the reflective mask blank 110 of the present embodiment is formed on the protective film 14. A basic function of the absorber film 24 is to absorb EUV light. The absorber film 24 may be the absorber film 24 for the purpose of absorbing EUV light, or may be the absorber film 24 having a phase shift function in consideration of a phase difference of EUV light. The absorber film 24 having a phase shift function absorbs EUV light and reflects a part of the EUV light to shift a phase of the EUV light. That is, in the reflective mask 200 in which the absorber film 24 having a phase shift function is patterned, in a portion where the absorber film 24 is formed, a part of light is reflected at a level that does not adversely affect pattern transfer while EUV light is absorbed and attenuated. In addition, in an area (field portion) where the absorber film 24 is not formed, EUV light is reflected by the multilayer reflective film 12 via the protective film 14. Therefore, a desired phase difference is generated between reflected light from the absorber film 24 having a phase shift function and reflected light from the field portion. The absorber film 24 having a phase shift function is preferably formed such that a phase difference between reflected light from the absorber film 24 and reflected light from the multilayer reflective film 12 is 170 to 260 degrees. Beams of light having a reversed phase difference around 180 degrees interfere with each other at a pattern edge portion to improve an image contrast of a projected optical image. As the image contrast is improved, resolution is increased, and various exposure-related margins such as an exposure margin and a focus margin can be increased.

The absorber film 24 may be a single-layer film or a multilayer film including a plurality of films (for example, a lower layer absorber film and an upper layer absorber film). In a case of a single layer film, since the number of steps at the time of manufacturing a mask blank can be reduced, production efficiency is improved. In a case of a multilayer film, the optical constant of an upper absorber film and the film thickness thereof can be appropriately set such that the upper absorber film serves as an antireflection film at the time of mask pattern defect inspection using light. This improves inspection sensitivity at the time of mask pattern defect inspection using light. In addition, when a film containing oxygen (O), nitrogen (N), and the like that improve oxidation resistance is used as the upper absorber film, temporal stability is improved. As described above, by forming the absorber film 24 into a multilayer film, various functions can be added to the absorber film 24. When the absorber film 24 has a phase shift function, by forming the absorber film 24 into a multilayer film, a range of adjustment on an optical surface can be increased, and therefore a desired reflectance can be easily obtained.

A material of the absorber film 24 is not particularly limited as long as the material has a function of absorbing EUV light, can be processed by etching or the like (preferably, can be etched by dry etching with a chlorine (Cl)-based gas and/or a fluorine (F)-based gas), and has a high etching selective ratio to the protective film 14. As a material having such a function, at least one metal selected from the group consisting of palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or a compound thereof can be preferably used.

The absorber film 24 can be formed by a magnetron sputtering method such as a DC sputtering method or an RF sputtering method. For example, the absorber film 24 such as a tantalum compound can be formed by a reactive sputtering method using a target containing tantalum and boron and using an argon gas containing oxygen or nitrogen.

The tantalum compound for forming the absorber film 24 includes an alloy formed of Ta and the above-described metal. When the absorber film 24 is an alloy of Ta, the crystalline state of the absorber film 24 is preferably an amorphous or microcrystalline structure from a viewpoint of smoothness and flatness. When a surface of the absorber film 24 is not smooth or flat, an absorber pattern 24a may have a large edge roughness and a poor pattern dimensional accuracy. The absorber film 24 has a surface roughness of preferably 0.5 nm or less, more preferably 0.4 nm or less, still more preferably 0.3 nm or less in terms of root mean square roughness (Rms).

Examples of the tantalum compound for forming the absorber film 24 include a compound containing Ta and B, a compound containing Ta and N, a compound containing Ta, O, and N, a compound containing Ta and B and further containing at least either O or N, a compound containing Ta and Si, a compound containing Ta, Si, and N, a compound containing Ta and Ge, a compound containing Ta, Ge, and N, and the like.

Ta is a material that has a large absorption coefficient for EUV light and can be easily dry-etched with a chlorine-based gas or a fluorine-based gas. Therefore, Ta can be said to be a material having excellent processability to be used for the absorber film 24. By further adding B, Si, and/or Ge, or the like to Ta, an amorphous material can be easily obtained. As a result, smoothness of the absorber film 24 can be improved. In addition, when N and/or O is added to Ta, resistance of the absorber film 24 to oxidation is improved, and therefore temporal stability of the absorber film 24 can be improved.

<Etching Mask Film>

The etching mask film 28 may be formed on the absorber film 24. As a material of the etching mask film 28, a material having a high etching selective ratio of the absorber film 24 to the etching mask film 28 is preferably used. The etching selective ratio of the absorber film 24 to the etching mask film 28 is preferably 1.5 or more, and more preferably 3 or more.

The reflective mask blank 110 of the present embodiment preferably includes the etching mask film 28 containing chromium (Cr) on the absorber film 24. As a material of the etching mask film 28, chromium or a chromium compound is preferably used. Examples of the chromium compound include a material containing Cr and at least one element selected from the group consisting of N, O, C, and H. The etching mask film 28 more preferably contains CrN, CrO, CrC, CrON, CrOC, CrCN, or CrOCN, and still more preferably is a CrO-based film (CrO film, CrON film, CrOC film, or CrOCN film) containing chromium and oxygen.

As a material of the etching mask film 28, tantalum or a tantalum compound is preferably used. Examples of the tantalum compound include a material containing Ta and at least one element selected from N, O, B, and H. The etching mask film 28 more preferably contains TaN, TaO, TaON, TaBN, TaBO, or TaBON.

As a material of the etching mask film 28, silicon or a silicon compound is preferably used. Examples of the silicon compound include a material containing Si and at least one element selected from the group consisting of N, O, C, and H, a metallic silicon containing silicon or a silicon compound and a metal (metal silicide), a metal silicon compound (metal silicide compound), and the like. Examples of the metal silicon compound include a material containing a metal, Si, and at least one element selected from the group consisting of N, O, C, and H.

The film thickness of the etching mask film 28 is preferably 3 nm or more in order to accurately form a pattern on the absorber film 24. In addition, the film thickness of the etching mask film 28 is preferably 15 nm or less in order to reduce the film thickness of the resist film 26.

<Conductive Back Film>

The conductive back film 22 for electrostatic chuck may be formed on a back surface of the substrate 100 (surface opposite to the side where the multilayer reflective film 12 is formed). Sheet resistance required for the conductive back film 22 for an electrostatic chuck is usually $100\Omega/\square$ ($\Omega$/square) or less. The conductive back film 22 can be formed by, for example, a magnetron sputtering method or an ion beam sputtering method using a target of a metal such as chromium or tantalum or an alloy thereof. A material of the conductive back film 22 is preferably a material containing chromium (Cr) or tantalum (Ta). For example, the material of the conductive back film 22 is preferably a Cr compound containing Cr and at least one selected from the group consisting of boron, nitrogen, oxygen, and carbon. Examples of the Cr compound include CrN, CrON, CrCN, CrCON, CrBN, CrBON, CrBCN, CrBOCN, and the like. In addition, the material of the conductive back film 22 is preferably Ta (tantalum), an alloy containing Ta, or a Ta compound containing either Ta or an alloy containing Ta and at least one selected from the group consisting of boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON, and the like.

The film thickness of the conductive back film 22 is not particularly limited as long as the conductive back film 22 functions as a film for electrostatic chuck, but is, for example, 10 nm to 200 nm.

<Method for Manufacturing Reflective Mask>

Using the reflective mask blank 110 of the present embodiment, the reflective mask 200 of the present embodiment can be manufactured. Hereinafter, an example of a method for manufacturing the reflective mask will be described.

Figure 4A:
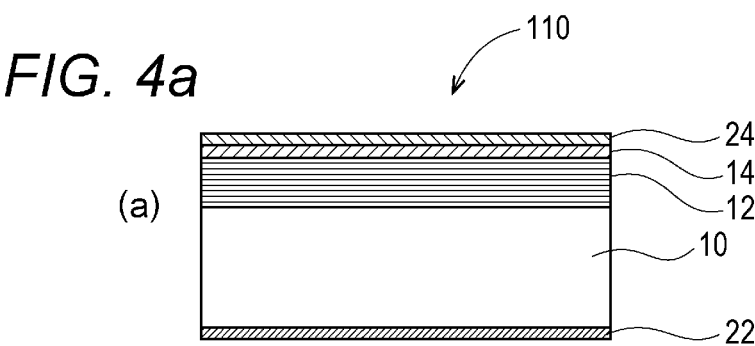
Figure 4B:
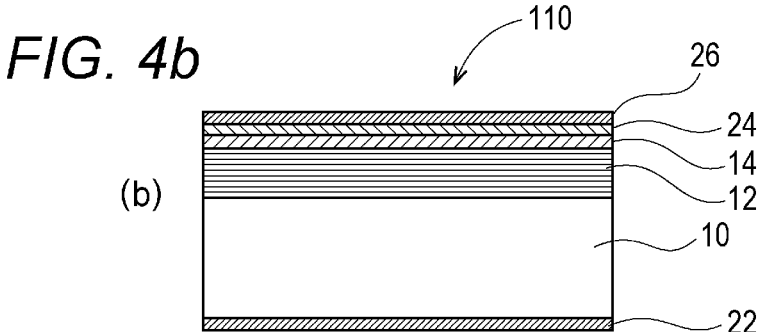
Figure 4C:
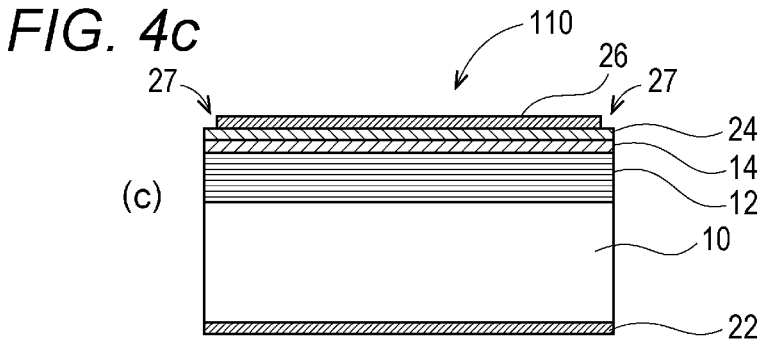
Figure 4D:
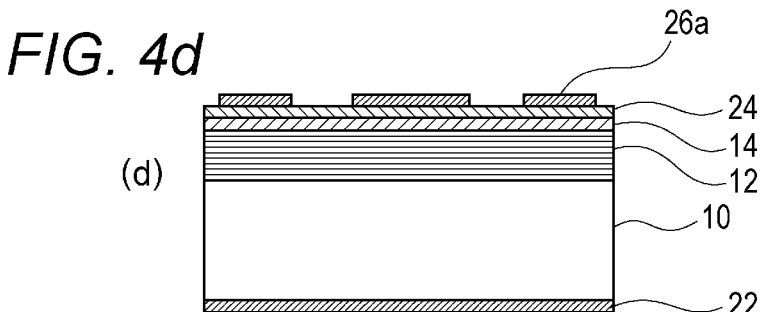

FIGS. 4a to 4f are schematic views illustrating an example of a method for manufacturing the reflective mask 200. As illustrated in FIGS. 4a to 4f, first, the reflective mask blank 110 including the substrate 10, the multilayer reflective film 12 formed on the substrate 10, the protective film 14 formed on the multilayer reflective film 12, the absorber film 24 formed on the protective film 14, and the conductive back film 22 formed on a back surface of the substrate 10 is prepared (FIG. 4a). Next, the resist film 26 is formed on the absorber film 24 (FIG. 4b). In order to suppress generation of dust due to peeling of the resist film 26 on a substrate peripheral edge portion 27, the resist film 26 on the substrate peripheral edge portion 27 is removed by a solvent in which the resist film 26 is dissolved (edge rinse) (FIG. 4c). A pattern is drawn on the resist film 26 with an electron beam drawing device, and then the resulting product is further developed and rinsed to form a resist pattern 26a (FIG. 4d).

Figures 4E, 4F, 5:
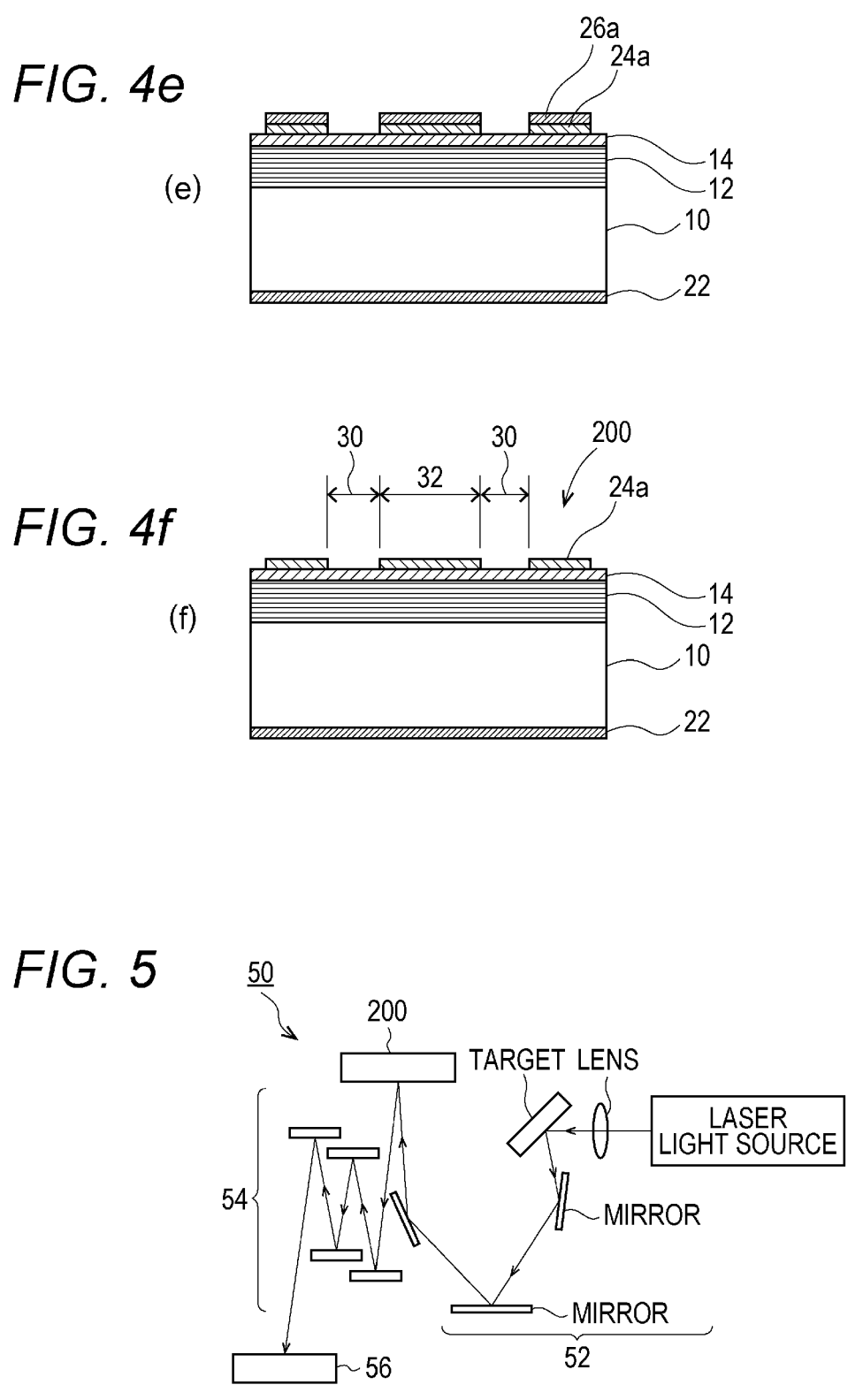

The absorber film 24 is dry-etched using the resist pattern 26a as a mask. As a result, a portion not covered with the resist pattern 26a in the absorber film 24 is etched to form the absorber pattern 24a (FIG. 4e).

As the etching gas of the absorber film 24, for example, a fluorine-based gas and/or a chlorine-based gas can be used. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

After the absorber pattern 24a is formed, the resist pattern 26a is removed with a resist peeling liquid. After the resist pattern 26a is removed, the resulting product is subjected to a wet cleaning step using an acidic or alkaline aqueous solution to obtain the reflective mask 200 of the present embodiment (FIG. 40.

Note that when the reflective mask blank 110 in which the etching mask film 28 is formed on the absorber film 24 is used, a step of forming a pattern (etching mask pattern) on the etching mask film 28 using the resist pattern 26a as a mask and then forming a pattern on the absorber film 24 using the etching mask pattern as a mask is added.

The reflective mask 200 thus obtained has a structure in which the multilayer reflective film 12, the protective film 14, and the absorber pattern 24a are layered on the substrate 10.

An area 30 where the multilayer reflective film 12 (including the protective film 14) is exposed has a function of reflecting EUV light. An area 32 in which the multilayer reflective film 12 (including the protective film 14) is covered with the absorber pattern 24a has a function of absorbing EUV light. According to the reflective mask 200 of the present embodiment, since the thickness of the absorber pattern 24a having a reflectance of, for example, 2.5% or less can be made thinner than before, a finer pattern can be transferred onto a transfer target object.

<Method for Manufacturing Semiconductor Device>

A transfer pattern can be formed on a semiconductor substrate by lithography using the reflective mask 200 of the present embodiment. This transfer pattern has a shape obtained by transferring a pattern of the reflective mask 200. By forming a transfer pattern on a semiconductor substrate with the reflective mask 200, a semiconductor device can be manufactured.

A method for transferring a pattern onto a semiconductor substrate 56 using EUV light will be described with reference to FIG. 5.

FIG. 5 illustrates a pattern transfer device 50. The pattern transfer device 50 includes a laser plasma X-ray source 52, the reflective mask 200, a reduction optical system 54, and the like. As the reduction optical system 54, an X-ray reflection mirror is used.

A pattern reflected by the reflective mask 200 is usually reduced to about ¼ by the reduction optical system 54. For example, a wavelength band of 13 to 14 nm is used as a light exposure wavelength, and an optical path is set in advance so as to be in a vacuum. Under such conditions, EUV light generated by the laser plasma X-ray source 52 is allowed to enter the reflective mask 200. Light reflected by the reflective mask 200 is transferred onto the semiconductor substrate 56 with resist via the reduction optical system 54.

The light reflected by the reflective mask 200 enters the reduction optical system 54. The light that has entered the reduction optical system 54 forms a transfer pattern on a resist film on the semiconductor substrate 56 with resist. By developing the resist film that has been exposed to light, a resist pattern can be formed on the semiconductor substrate 56 with resist. By etching the semiconductor substrate 56 using this resist pattern as a mask, for example, a predetermined wiring pattern can be formed on the semiconductor substrate. A semiconductor device can be manufactured through such a step and other necessary steps.

EXAMPLES

Hereinafter, Examples 1 to 5 and Comparative Example 1 will be described with reference to the drawings.

(Substrate with a Multilayer Reflective Film 100)

First, the substrate 10 having a 6025 size (about 152 mm×152 mm×6.35 mm) and having a main surface polished was prepared. The substrate 10 is a substrate made of low thermal expansion glass ($SiO_2$—$TiO_2$-based glass). The main surfaces of the substrates 10 were polished through a rough polishing step, a precision polishing step, a local processing step, and a touch polishing step.

Next, the multilayer reflective film 12 was formed on the main surface of the substrate 10. The multilayer reflective film 12 formed on the substrate 10 was a periodic multilayer reflective film 12 containing Mo and Si in order to make the multilayer reflective film 12 suitable for EUV light having a wavelength of 13.5 nm. The multilayer reflective film 12 was formed using a Mo target and a Si target by alternately building up a Mo layer and a Si layer on the substrate 10 by an ion beam sputtering method using krypton (Kr) as a process gas. First, a Si film was formed so as to have a thickness of 4.2 nm, and subsequently a Mo film was formed so as to have a thickness of 2.8 nm. This stack was counted as one period, and the Si film and the Mo film were built up for 40 periods in a similar manner. Thereafter, finally, the Si film was formed with a thickness of 4.0 nm. When the multilayer reflective film 12 was formed by an ion beam sputtering method, an angle of a substrate and an angle of a sputtering target were set as presented in Table 1 below.

TABLE 1

| | Substrate angle when Mo film is formed (degrees) | Substrate angle when Si film is formed (degrees) | Angle of Mo target (degrees) | Angle of Si target (degrees) | Film forming process of multilayer reflective film and protective film |
|---|---|---|---|---|---|
| Example 1 | 30 | 40 | 60 | 60 | Continuous |
| Example 2 | 30 | 32 | 30 | 25 | Continuous |
| Example 3 | 30 | 30 | 60 | 40 | Continuous |
| Example 4 | 30 | 30 | 50 | 50 | Discontinuous |
| Example 5 | 40 | 20 | 40 | 30 | Discontinuous |
| Comparative Example 1 | 25 | 50 | 65 | 65 | Continuous |

Furthermore, in Comparative Example 1, an outermost periphery of the multilayer reflective film 12 was irradiated with laser light. A $CO_2$ laser (CW, wavelength: 10.6 μm, output: 3 W) was used for the laser light irradiation. By performing scanning with a beam focused such that an irradiation beam diameter of the laser light was φ 200 μm, the laser light irradiation was performed under a condition of an irradiation time of 300 ms. The laser light was emitted within a range of 6 mm from an outermost peripheral end portion of the multilayer reflective film 12.

In Example 1 to 3, after the multilayer reflective film 12 was formed, the Ru protective film 14 (film thickness: 2.5 nm) was further formed on the multilayer reflective film 12 continuously by an ion beam sputtering method. When the Ru protective film 14 was formed by the ion beam sputtering method, an incident angle of a Ru sputtered particle to a normal line of the main surface of the substrate 10 was set to 40 degrees, and a gas flow rate of an ion source was set to 8 sccm. In Examples 4 and 5, after the multilayer reflective film 12 was formed, the substrate with a multilayer reflective film was temporarily taken out from a chamber into the atmosphere, and the Ru protective film 14 was formed discontinuously from the formation of the multilayer reflective film 12. The Ru protective film 14 was formed so as to have a film thickness of 2.5 nm by a DC magnetron sputtering method using a Ru target in an Ar gas atmosphere.

Note that, in Examples 1 to 5 and Comparative Example 1 described above, when the multilayer reflective film 12 and the protective film 14 were formed, the substrate 10 was held using a mechanical chuck device, and the multilayer reflective film 12 was formed. Therefore, the multilayer reflective film 12 formed on the main surface of the substrate 10 did not go around an end surface of the substrate 10, and was not formed on an outer periphery of the main surface of the substrate 10.

As described above, the substrates with a multilayer reflective film 100 of Examples 1 to 5 and Comparative Example 1 were manufactured.

(Reflective Mask Blank 110)

Next, the reflective mask blank 110 was manufactured using the above-described substrate with a multilayer reflective film 100. Hereinafter, a method for manufacturing the reflective mask blank 110 will be described.

The absorber film 24 was formed on the protective film 14 of the substrate with a multilayer reflective film 100 by a DC magnetron sputtering method. The absorber film 24 was the absorber film 24 of a layered film including two layers of a TaN film as an absorption layer and a TaO film as a low reflection layer. On a surface of the protective film 14 of the above-described substrate with a multilayer reflective film 100, a TaN film was formed as an absorption layer by a DC magnetron sputtering method. The TaN film was formed by a reactive sputtering method in a mixed gas atmosphere of an Ar gas and a $N_2$ gas with the substrate with a multilayer reflective film 100 facing a Ta target. Next, a TaO film (low reflection layer) was further formed on the TaN film by a DC magnetron sputtering method. Similarly to the TaN film, this TaO film was formed by a reactive sputtering method in a mixed gas atmosphere of Ar and $O_2$ with the substrate with a multilayer reflective film 100 facing a Ta target.

The composition (atomic ratio) of the TaN film was Ta:N=70:30, and the film thickness thereof was 48 nm. The composition (atomic ratio) of the TaO film was Ta:O=35:65, and the film thickness thereof was 11 nm.

Next, the conductive back film 22 formed of CrN was formed on a back surface of the substrate 10 by a magnetron sputtering method (reactive sputtering method) under the following conditions.

Conditions for forming the conductive back film 22: a Cr target, a mixed gas atmosphere of Ar and $N_2$ (Ar: 90 atomic %, N: 10 atomic %), and a film thickness of 20 nm.

Note that, when the absorber film 24 and the conductive back film 22 were formed, the absorber film 24 and the conductive back film 22 were formed by shielding a part of the outer periphery of the substrate 10 such that the absorber film 24 and the conductive back film 22 did not go around the end surface of the substrate 10.

As described above, the reflective mask blanks 110 of Examples 1 to 5 and Comparative Example 1 were manufactured.

(Evaluation of Reflective Mask Blank 110)

Figure 6:
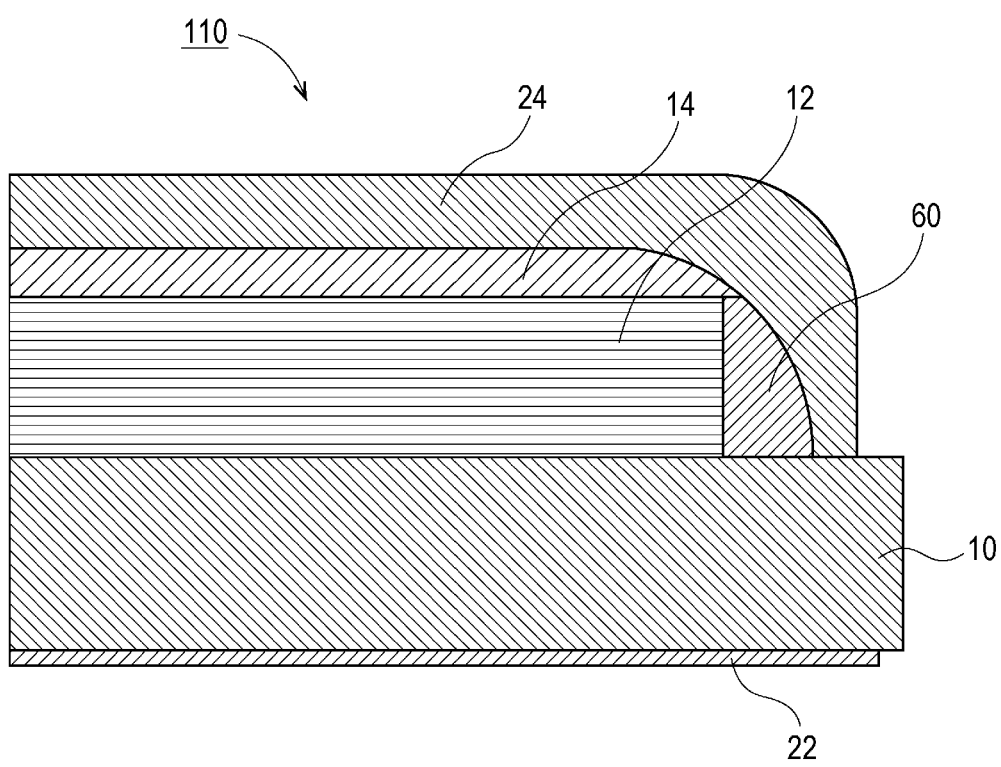
FIG. 6 is a schematic cross-sectional view enlarging an outermost periphery of the multilayer reflective film.

A cross section of the outermost periphery of the multilayer reflective films 12 of each of the manufactured reflective mask blanks 110 of Examples 1 to 5 was observed with TEM. FIG. 6 is an enlarged schematic view of a cross section of an outermost periphery 60 of the multilayer reflective film 12 of the reflective mask blank 110. As illustrated in FIG. 6, the interface between the Mo layer and the Si layer was eliminated in the outermost periphery 60 of the multilayer reflective film 12. In addition, it was confirmed that a compound formed of molybdenum silicide was formed in the outermost periphery 60 of the multilayer reflective film 12. Furthermore, it was confirmed that the thickness of the outermost periphery 60 of the multilayer reflective film 12 gradually decreased from the center of the substrate 10 toward the outside.

For each of the reflective mask blanks 110 of Examples 1 to 5 and Comparative Example 1, the composition of the outermost periphery 60 of the multilayer reflective film 12 was analyzed by TEM-EDX, and a result thereof is presented in Table 2 below.

TABLE 2

| | Composition of outermost periphery of multilayer reflective film (atomic %) | Si/(Mo + Si) |
|---|---|---|
| Example 1 | Mo: 52, Si: 48 | 0.48 |
| Example 2 | Mo: 60, Si: 40 | 0.40 |
| Example 3 | Mo: 68, Si: 32 | 0.32 |
| Example 4 | Mo: 50, Si: 39, O: 11 | 0.44 |
| Example 5 | Mo: 55, Si: 22, O: 23 | 0.28 |
| Comparative Example 1 | Mo: 46, Si: 54 | 0.54 |

SPM cleaning was performed on the reflective mask blanks 110 of Examples 1 to 5 and Comparative Example 1. Cleaning conditions are as follows.

Cleaning liquid $H_2SO_4:H_2O_2=2:1$ (weight ratio)

Cleaning temperature 120° C.

Cleaning time 10 minutes

For the reflective mask blanks 110 of Examples 1 to 5 and Comparative Example 1 after cleaning, an area of 132 mm×132 mm on a surface of the absorber film 24 was subjected to defect inspection using a high-sensitivity defect inspection apparatus ("MAGICS series" manufactured by Lasertec Inc.) having an inspection light source wavelength of 355 nm. As a result, no defect was detected in the reflective mask blank 110 of each of Examples 1 to 5 and Comparative Example 1.

Next, on the absorber film 24 of each of the reflective mask blanks 110 of Examples 1 to 5 and Comparative Example 1, the resist film 26 was formed. Thereafter, the resist film 26 on the substrate peripheral edge portion was removed by a solvent in which the resist film 26 was dissolved to manufacture a reflective mask blank from which the resist film 26 on the substrate peripheral edge portion had been removed.

Next, defects caused by film peeling of the multilayer reflective film due to cleaning or the like during the mask manufacturing process and use of a mask were evaluated.

For the reflective mask blank from which the resist film 26 on the substrate peripheral edge portion had been removed, the absorber film 24 was removed by etching using the resist film 24 as a mask. Specifically, an area where the absorber film 24 was exposed was removed by etching using the resist film 24 as a mask.

Thereafter, the SPM cleaning described above was performed. Note that the SPM cleaning was performed under the same cleaning conditions as described above.

In a similar manner to the above, for each of the reflective mask blanks of Examples 1 to 5 and Comparative Example 1 after cleaning, an area of 132 mm×132 mm on a surface of the absorber film 24 was subjected to defect inspection using a high-sensitivity defect inspection apparatus ("MAGICS series" manufactured by Lasertec Inc.) having an inspection light source wavelength of 355 nm.

As a result of the defect inspection, in the reflective mask blank 110 of Example 1, the number of detected defects was 2. In each of the reflective mask blanks 110 of Examples 2 to 5, the number of detected defects was 0. Meanwhile, in the reflective mask blank 110 of Comparative Example 1, the number of detected defects was 20.

In the reflective mask blank 110 of Comparative Example 1, more defects were detected on the surface of the absorber film 24 than in Examples 1 to 5. A reason for such a result is considered to be that, in the reflective mask blank 110 of Comparative Example 1, the Si content in the outermost periphery 60 of the multilayer reflective film 12 was high. That is, it is considered that this is because film peeling of the multilayer reflective film occurred more frequently and more defects on the absorber film due to film peeling occurred because the silicide film having a high Si content has a high compressive stress. Meanwhile, in each of the reflective mask blanks 110 of Examples 1 to 5, the compressive stress of the outermost periphery 60 was low because the Si content of the outermost periphery 60 of the multilayer reflective film 12 was low, and it is considered that occurrence of defects on the absorber film 24 due to film peeling of the multilayer reflective film 12 could be reduced.

Therefore, when the reflective mask 200 is manufactured using each of the reflective mask blanks 110 of Examples 1 to 5, it is possible to reduce occurrence of defects on the multilayer reflective film or on the absorber film due to film peeling of the multilayer reflective film 12 due to cleaning during the mask manufacturing process or use of a mask. Meanwhile, in the case of Comparative Example 1, it is considered that film peeling of the multilayer reflective film occurs due to cleaning during the mask manufacturing process or use of a mask, and many defects occur on the multilayer reflective film or on the absorber film due to film peeling of the multilayer reflective film.

(Manufacture of Reflective Mask 200)

The reflective mask blanks 110 of Examples 1 to 5 and Comparative Example 1 were prepared separately from the above-described reflective mask blanks for which defects caused by film peeling of the multilayer reflective film were evaluated. Next, the resist film 26 was formed on the absorber film 24 in the reflective mask blank 110, and then the resist film 26 on a substrate peripheral edge portion was removed. Next, a pattern was drawn and developed on the resist film 26 by an electron beam drawing device to form a resist pattern 20*a*. Thereafter, the absorber film 24 was dry-etched using the resist pattern 20*a* as a mask to form an absorber pattern 24*a*. As described above, the reflective mask 200 was manufactured.

The reflective mask 200 thus obtained was subjected to mask cleaning by SPM cleaning. The reflective mask 200 was subjected to defect inspection using a high-sensitivity defect inspection apparatus capable of defect inspection that can detect a defect having a sphere equivalent volume diameter (SEVD) of 21.5 nm. No defect due to film peeling of the multilayer reflective film 12 was detected on the multilayer reflective film 12 of the reflective mask 200 or on the absorber pattern 24*a*.

Meanwhile, when the defect inspection was performed on the reflective mask manufactured using the reflective mask blank of Comparative Example 1, fourteen defects caused by film peeling of the multilayer reflective film 12 were detected on the multilayer reflective film 12 and on the absorber pattern 24*a*.

REFERENCE SIGNS LIST

10 Substrate
12 Multilayer reflective film
14 Protective film
22 Conductive back film
24 Absorber film
26 Resist film
28 Etching mask film
60 Outermost periphery
100 Substrate with a multilayer reflective film
110 Reflective mask blank
200 Reflective mask

The invention claimed is:

1. A substrate with a multilayer reflective film comprising: a substrate and a multilayer reflective film formed on a main surface of the substrate, wherein the multilayer reflective film comprises a high refractive index layer and a low refractive index layer alternately layered, the high refractive index layer comprises Si, and the low refractive index layer comprises a transition metal, an outermost periphery of the multilayer reflective film comprises a compound comprising the Si and the transition metal, and a ratio of a content (atomic %) of the Si to a total content (atomic %) of the Si and the transition metal in the compound is 0.10 or more and 0.50 or less.

2. The substrate with a multilayer reflective film according to claim 1, wherein the compound comprises oxygen.

3. The substrate with a multilayer reflective film according to claim 2, wherein a content of the oxygen in the compound is 0.5 atomic % or more and 75 atomic % or less.

4. The substrate with a multilayer reflective film according to claim 3, further comprising a protective film formed on the multilayer reflective film.

5. The substrate with a multilayer reflective film according to claim 2, further comprising a protective film formed on the multilayer reflective film.

6. The substrate with a multilayer reflective film according to claim 1, further comprising a protective film formed on the multilayer reflective film.

7. The substrate with a multilayer reflective film according to claim 1, wherein the transition metal comprises Ru, Rh, or Pt.

8. The substrate with a multilayer reflective film according to claim 1, wherein the compound comprises molybdenum silicide.

9. The substrate with a multilayer reflective film according to claim 1, wherein in the outermost periphery of the multilayer reflective film, an interface between the high refractive index layer and the low refractive index layer is eliminated and replaced with the compound.

10. A reflective mask blank comprising: a substrate, a multilayer reflective film formed on a main surface of the substrate, and an absorber film, wherein the multilayer reflective film comprises a high refractive index layer and a low refractive index layer alternately layered, the high refractive index layer comprises Si, and the low refractive index layer comprises a transition metal, an outermost periphery of the multilayer reflective film comprises a compound comprising the Si and the transition metal, and a ratio of a content (atomic %) of the Si to a total content (atomic %) of the Si and the transition metal in the compound is 0.10 or more and 0.50 or less.

11. The reflective mask blank according to claim 10, wherein the compound comprises oxygen.

12. The reflective mask blank according to claim 11, wherein a content of the oxygen in the compound is 0.5 atomic % or more and 75 atomic % or less.

13. The reflective mask blank according to claim 12, further comprising a protective film formed between the multilayer reflective film and the absorber film, wherein the protective film is formed of a material having different etching selectivity from the absorber film.

14. The reflective mask blank according claim 12, further comprising a resist film formed on the absorber film.

15. The reflective mask blank according to claim 14, wherein an end portion of an outer periphery of the resist film is located above an outermost periphery of the multilayer reflective film formed of the compound.

16. The reflective mask blank according to claim 11, further comprising a protective film formed between the multilayer reflective film and the absorber film, wherein the protective film is formed of a material having different etching selectivity from the absorber film.

17. The reflective mask blank according claim 11, further comprising a resist film formed on the absorber film.

18. The reflective mask blank according to claim 17, wherein an end portion of an outer periphery of the resist film is located above an outermost periphery of the multilayer reflective film formed of the compound.

19. The reflective mask blank according to claim 10, further comprising a protective film formed between the multilayer reflective film and the absorber film, wherein the protective film is formed of a material having different etching selectivity from the absorber film.

20. The reflective mask blank according to claim 10, further comprising a resist film formed on the absorber film.

21. The reflective mask blank according to claim 20, wherein an end portion of an outer periphery of the resist film is located above an outermost periphery of the multilayer reflective film formed of the compound.

22. A method for manufacturing a reflective mask, the method comprising preparing the reflective mask blank according to claim 20 and patterning the absorber film to form an absorber pattern on the multilayer reflective film.

23. A method for manufacturing a semiconductor device, the method comprising transferring an absorber pattern onto a resist film on a semiconductor substrate using a reflective mask obtained by the method for manufacturing a reflective mask according to claim 22.

* * * * *